United States Patent
Yatagawa et al.

(10) Patent No.: US 12,131,869 B2
(45) Date of Patent: Oct. 29, 2024

(54) MULTI-LAYER CERAMIC ELECTRONIC COMPONENT AND CIRCUIT BOARD

(71) Applicant: Taiyo Yuden Co., Ltd., Tokyo (JP)

(72) Inventors: Kiyoshiro Yatagawa, Tokyo (JP); Satoshi Kobayashi, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 187 days.

(21) Appl. No.: 17/823,129

(22) Filed: Aug. 30, 2022

(65) Prior Publication Data

US 2023/0093850 A1 Mar. 30, 2023

(30) Foreign Application Priority Data

Sep. 22, 2021 (JP) .................................. 2021-153810

(51) Int. Cl.
| | |
|---|---|
| *H01G 4/30* | (2006.01) |
| *H01G 2/06* | (2006.01) |
| *H01G 4/012* | (2006.01) |
| *H01G 4/224* | (2006.01) |
| *H01G 4/232* | (2006.01) |

(52) U.S. Cl.
CPC .............. *H01G 4/30* (2013.01); *H01G 2/065* (2013.01); *H01G 4/012* (2013.01); *H01G 4/224* (2013.01); *H01G 4/232* (2013.01)

(58) Field of Classification Search
None
See application file for complete search history.

(56) References Cited

U.S. PATENT DOCUMENTS

| | | | |
|---|---|---|---|
| 9,336,952 B2 * | 5/2016 | Chung | H01G 4/30 |
| 2012/0120547 A1 * | 5/2012 | Ro | H01G 4/30 29/842 |
| 2015/0077898 A1 * | 3/2015 | Chung | H01G 4/30 427/79 |
| 2016/0099106 A1 * | 4/2016 | Kurokawa | H01G 4/12 336/200 |

(Continued)

FOREIGN PATENT DOCUMENTS

| | | | | |
|---|---|---|---|---|
| CN | 111739732 A | * | 10/2020 | ............ H01G 4/005 |
| JP | 2017191880 | | 10/2017 | |
| JP | 2019134068 A | * | 8/2019 | ............... H01G 2/04 |

(Continued)

*Primary Examiner* — Dion R. Ferguson
(74) *Attorney, Agent, or Firm* — CHIP LAW GROUP

(57) ABSTRACT

A multi-layer ceramic electronic component includes a ceramic body and a pair of external electrodes. The ceramic body includes a pair of main surfaces perpendicular to a first axis, a pair of end surfaces perpendicular to a second axis, a pair of side surfaces perpendicular to a third axis, and internal electrodes drawn to the end surfaces, and has a substantially rectangular parallelepiped shape. The external electrodes each include an end-surface-covering portion that covers one of the end surfaces, and a main-surface-covering portion that is formed to be continuous from the end-surface-covering portion and covers a part of the main surface. The main-surface-covering portion includes a conductive resin layer, and first and second convex portions formed on the basis of a shape of the conductive resin layer, each swelling toward the center in the direction of the second axis, and disposed apart from each other in the third axis direction.

8 Claims, 12 Drawing Sheets

(56) References Cited

U.S. PATENT DOCUMENTS

2019/0237250 A1* 8/2019 Onodera ................ H01G 2/065
2023/0093850 A1* 3/2023 Yatagawa .............. H01G 4/012
361/301.4

FOREIGN PATENT DOCUMENTS

KR          20150031908  A  *  3/2015
KR           2016033032  A  *  3/2016   .............. H01G 4/12
KR          20200115204  A  *  10/2020

* cited by examiner

MULTI-LAYER CERAMIC ELECTRONIC COMPONENT AND CIRCUIT BOARD

BACKGROUND ART

The present disclosure relates to a multi-layer ceramic electronic component and a circuit board.

Multi-layer ceramic electronic components such as multi-layer ceramic capacitors are also widely used in in-vehicle equipment with the trend toward electronic control of automobiles. For example, in the in-vehicle equipment, a substrate on which a multi-layer ceramic electronic component is mounted may be disposed under environments where temperature change is very large. If the substrate is subjected to a large temperature change, the substrate undergoes thermal expansion and thermal contraction, which may cause stress also in the multi-layer ceramic electronic component. For example, Japanese Patent Application Laid-open No. 2017-191880 discloses a multi-layer ceramic electronic component including an external electrode including a conductive resin layer having a high flexibility from the viewpoint of suppressing the occurrence of cracks resulting from such stress.

SUMMARY OF THE INVENTION

The multi-layer ceramic electronic component is generally mounted on a substrate by solder, with the lower surface of the external electrode facing the substrate. When the substrate is deflected convexly upward, the lower surface of the external electrode undergoes stress in the direction apart from the substrate. When this stress locally concentrates, even the conductive resin layer having a high flexibility cannot withstand the stress, and the external electrode is peeled off from the ceramic body in some cases.

In view of the circumstances as described above, it is desirable to provide a multi-layer ceramic electronic component and a circuit board that are capable of suppressing peel-off of an external electrode from a ceramic body after mounting.

Additional or separate features and advantages of the disclosure will be set forth in the descriptions that follow and in part will be apparent from the description, or may be learned by practice of the disclosure. The objectives and other advantages of the disclosure will be realized and attained by the structure particularly pointed out in the written description and claims thereof as well as the appended drawings.

To achieve these and other advantages and in accordance with the purpose of the present disclosure, according to one embodiment of the present disclosure, there is provided a multi-layer ceramic electronic component including a ceramic body and a pair of external electrodes.

The ceramic body includes a pair of main surfaces perpendicular to a first axis, a pair of end surfaces perpendicular to a second axis orthogonal to the first axis, a pair of side surfaces perpendicular to a third axis orthogonal to the first axis and the second axis, and a plurality of internal electrodes drawn to the pair of end surfaces. The ceramic body is configured to have a substantially rectangular parallelepiped shape.

The pair of external electrodes face each other in a direction of the second axis and each include an end-surface-covering portion that covers one of the pair of end surfaces, and a main-surface-covering portion that is formed to be continuous from the end-surface-covering portion and covers a part of one of the pair of main surfaces.

The main-surface-covering portion includes a conductive resin layer, and a first convex portion and a second convex portion that are formed on a basis of a shape of the conductive resin layer.

The first convex portion and the second convex portion each swell toward the center in the direction of the second axis and are disposed apart from each other in a direction of the third axis.

In the above configuration, the main-surface-covering portion, which may face a substrate at the time of mounting, includes the first convex portion and the second convex portion formed on the basis of the shape of the conductive resin layer. With this configuration, even when the substrate is deflected to a large extent due to a temperature change after mounting, and a large stress is caused in the main-surface-covering portion, such a stress can be distributed to the first convex portion and the second convex portion. Therefore, the main-surface-covering portion can be prevented from peeling off from the ceramic body due to the concentration of stress.

For example, the main-surface-covering portion may have a first peak dimension in the direction of the second axis from an outer edge of the main-surface-covering portion to a first top of the first convex portion, the outer edge being located outward in the direction of the second axis, the first top being most adjacent to the center in the direction of the second axis, and a second peak dimension in the direction of the second axis from the outer edge to a second top of the second convex portion, the second top being most adjacent to the center in the direction of the second axis, and each of the first peak dimension and the second peak dimension may be 1.5 times or more a minimum dimension of the main-surface-covering portion in the direction of the second axis.

For example, each of the first peak dimension and the second peak dimension may be $\frac{1}{10}$ or more and $\frac{2}{5}$ or less of a dimension of the multi-layer ceramic electronic component in the direction of the second axis.

This makes it possible to enhance the effect of distributing the stress.

Further, the first peak dimension may be larger than the second peak.

For example, the first peak dimension may be 1.1 times or more and 1.5 times or less the second peak dimension.

This makes it possible to satisfactorily ensure the first peak dimension of the first convex portion and to improve the mitigation of stress and the adhesion to the ceramic body, for example.

For example, a separation distance in the direction of the third axis between a first top of the first convex portion most adjacent to the center in the direction of the second axis and a second top of the second convex portion most adjacent to the center in the direction of the second axis may be $\frac{1}{5}$ or more and $\frac{1}{2}$ or less of a dimension of the multi-layer ceramic electronic component in the direction of the third axis.

This makes it possible to more reliably distribute the stress caused in the first convex portion and the second convex portion. Further, this makes it difficult to cause the stress outward in the third axis direction, and makes it possible to stabilize the posture of the multi-layer ceramic electronic component.

In addition, each of the pair of external electrodes may further include a base layer extending from the end-surface-covering portion to a part of the main-surface-covering portion, and a plating layer constituting a superficial layer of the end-surface-covering portion and the main-surface-covering portion.

In this case, the conductive resin layer may cover the base layer and extend toward the center in the direction of the second axis beyond the base layer in the main-surface-covering portion, and the first convex portion and the second convex portion may each have a laminated structure including the conductive resin layer and the plating layer.

This makes it possible to bring the conductive resin layer into direct contact with the ceramic body in each of the first convex portion and the second convex portion. Therefore, the influence of the stress on the ceramic body can be reduced by the conductive resin layer, and cracks can be prevented from being generated in the ceramic body. Further, the adhesion of the first convex portion and the second convex portion to the ceramic body can also be enhanced.

According to another embodiment of the present disclosure, there is provided a circuit board including a multi-layer ceramic electronic component and a mounting substrate including a connection electrode.

The multi-layer ceramic electronic component includes a ceramic body and a pair of external electrodes.

The ceramic body includes a pair of main surfaces perpendicular to a first axis, a pair of end surfaces perpendicular to a second axis orthogonal to the first axis, a pair of side surfaces perpendicular to a third axis orthogonal to the first axis and the second axis, and a plurality of internal electrodes drawn to the pair of end surfaces. The ceramic body is configured to have a substantially rectangular parallelepiped shape.

The pair of external electrodes face each other in a direction of the second axis and each include an end-surface-covering portion that covers one of the pair of end surfaces, and a main-surface-covering portion that is formed to be continuous from the end-surface-covering portion and covers a part of one of the pair of main surfaces.

The main-surface-covering portion include a conductive resin layer, and a first convex portion and a second convex portion that are formed on a basis of a shape of the conductive resin layer.

The first convex portion and the second convex portion each swell toward the center in the direction of the second axis, and are disposed apart from each other in a direction of the third axis.

Further, the main-surface-covering portion may be disposed to face the connection electrode.

As described above, according to the present disclosure, it is possible to provide a multi-layer ceramic electronic component and a circuit board that are capable of suppressing peel-off of an external electrode from a ceramic body after mounting.

These and other objects, features and advantages of the present disclosure will become more apparent in light of the following detailed description of embodiments thereof, as illustrated in the accompanying drawings.

It is to be understood that both the foregoing general description and the following detailed description are exemplary and explanatory, and are intended to provide further explanation of the disclosure as claimed.

DETAILED DESCRIPTION OF THE EMBODIMENTS

Hereinafter, embodiments of the present disclosure will be described with reference to the drawings.

In the figures, the X-axis, the Y-axis, and the Z-axis orthogonal to one another are shown as appropriate. The X-axis, the Y-axis, and the Z-axis are common in all figures.

1. BASIC CONFIGURATION OF MULTI-LAYER CERAMIC CAPACITOR 10

Figure 1:
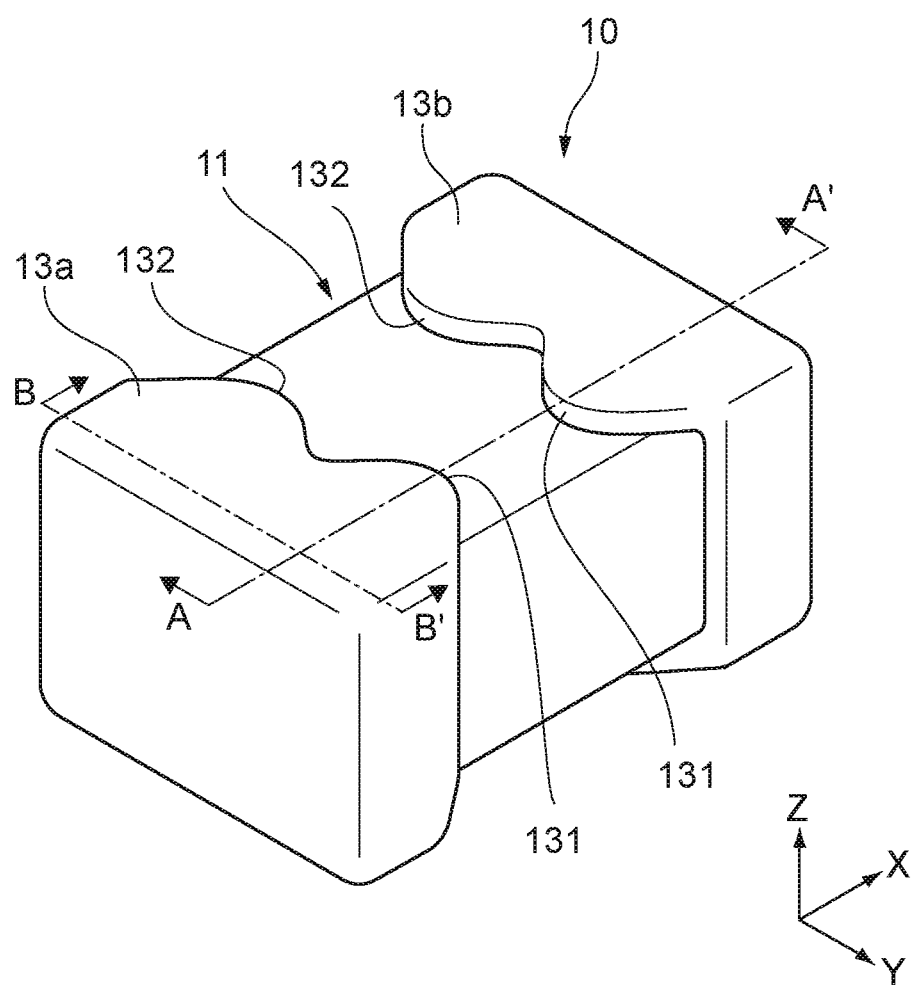
FIG. 1 is a perspective view of a multi-layer ceramic capacitor according to an embodiment of the present disclosure.
Figure 2:
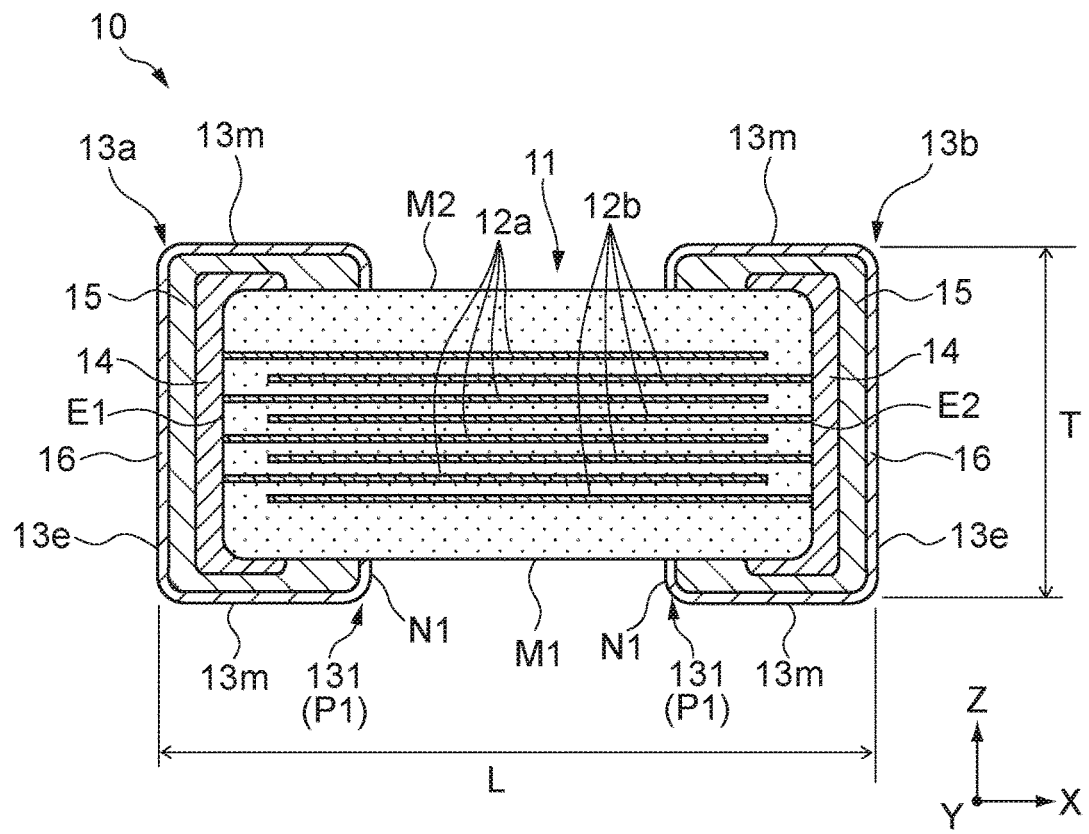
FIG. 2 is a cross-sectional view of the multi-layer ceramic capacitor taken along the line A-A' of FIG. 1.
Figure 3:
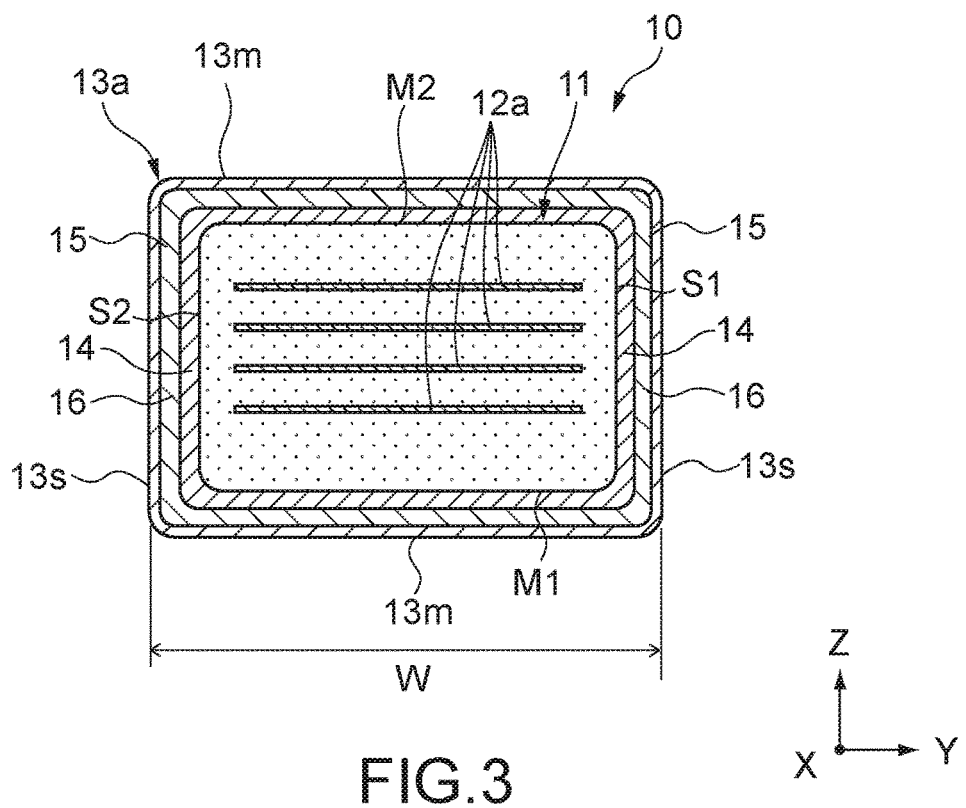
FIG. 3 is a cross-sectional view of the multi-layer ceramic capacitor taken along the line B-B' of FIG. 1.

FIGS. 1 to 3 each show a multi-layer ceramic capacitor 10 according to an embodiment of the present disclosure. FIG. 1 is a perspective view of the multi-layer ceramic capacitor 10.

FIG. 2 is a cross-sectional view of the multi-layer ceramic capacitor 10 taken along the line A-A' of FIG. 1. FIG. 3 is a cross-sectional view of the multi-layer ceramic capacitor 10 taken along the line B-B' of FIG. 1.

The multi-layer ceramic capacitor 10 includes a ceramic body 11, a first external electrode 13a, and a second external electrode 13b. The surface of the ceramic body 11 includes first and second end surfaces E1 and E2 perpendicular to the X-axis, first and second side surfaces S1 and S2 perpendicular to the Y-axis, and first and second main surfaces M1 and M2 perpendicular to the Z-axis. In other words, the ceramic body 11 has a substantially rectangular parallelepiped shape. It is favorable that the ceramic body 11 is chamfered and ridges connecting the surfaces of the ceramic body 11 are formed of rounded, curved surfaces.

The maximum dimension of the multi-layer ceramic capacitor 10 in the X-axis direction is assumed as a dimension L. The maximum dimension of the multi-layer ceramic capacitor 10 in the Y-axis direction is assumed as a dimension W. The maximum dimension of the multi-layer ceramic capacitor 10 in the Z-axis direction is assumed as a dimension T. Those dimensions are not particularly limited, but may take the following ranges, for example. The dimension L is, for example, 1.0 mm or more and 6.5 mm or less. The dimension W is, for example, 0.5 mm or more and 5.5 mm or less. The dimension T is, for example, 0.5 mm or more and 3.0 mm or less. The multi-layer ceramic capacitor 10 has, for example, the size with the dimension L of 3.2 mm and the dimension W and the dimension T of 2.5 mm, the size with the dimension L of 1.6 mm and the dimension W and the dimension T of 0.8 mm, or the size with the dimension L of 1.0 mm and the dimension W and the dimension T of 0.5 mm.

In the multi-layer ceramic capacitor 10, the first external electrode 13a covers the first end surface E1 of the ceramic body 11, and the second external electrode 13b covers the second end surface E2 of the ceramic body 11. The first and second external electrodes 13a and 13b face each other in the X-axis direction with the ceramic body 11 interposed therebetween and function as the terminals of the multi-layer ceramic capacitor 10.

The first and second external electrodes 13a and 13b extend from the first and second end surfaces E1 and E2, respectively, toward the center in the X-axis direction along the first and second main surfaces M1 and M2 and the first and second side surfaces S1 and S2 of the ceramic body 11. With this configuration, the first and second external electrodes 13a and 13b have U-shaped cross sections parallel to the X-Z plane shown in FIG. 2 and parallel to the X-Y plane.

Note that the phrase "toward the center in the X-axis direction" means a portion closer to a virtual Y-Z plane that bisects the multi-layer ceramic capacitor 10 in the X-axis direction. Meanwhile, the phrase "located outward in the X-axis direction" means a portion farther from such a Y-Z plane. Similarly, the phrase "toward the center in the Y-axis direction" means a portion closer to a virtual X-Z plane that bisects the multi-layer ceramic capacitor 10 in the Y-axis direction. Meanwhile, the phrase "located outward in the Y-axis direction" means a portion farther from such an X-Z plane.

The ceramic body 11 is formed of dielectric ceramics. The ceramic body 11 includes a plurality of first internal electrodes 12a and a plurality of second internal electrodes 12b that are covered with dielectric ceramics. In the example shown in FIGS. 2 and 3, the first and second internal electrodes 12a and 12b each have a sheet-like shape extending along the X-Y plane and are alternately disposed along the Z-axis direction.

The ceramic body 11 includes an opposing region in which the first and second internal electrodes 12a and 12b are opposed to each other in the Z-axis direction with ceramic layers interposed therebetween. The first internal electrodes 12a are drawn to the first end surface E1 from the opposing region and connected to the first external electrode 13a. The second internal electrodes 12b are drawn to the second end surface E2 from the opposing region and connected to the second external electrode 13b.

With the configuration described above, when a voltage is applied between the first external electrode 13a and the second external electrode 13b in the multi-layer ceramic capacitor 10, the voltage is applied to the ceramic layers in the opposing region including the first and second internal electrodes 12a and 12b. Thus, the multi-layer ceramic capacitor 10 stores charge corresponding to the voltage applied between the first and second external electrodes 13a and 13b.

In the ceramic body 11, in order to increase a capacitance of each ceramic layer provided between the first and second internal electrodes 12a and 12b, dielectric ceramics having a high dielectric constant is used. The dielectric ceramics can mainly contain, for example, a ceramic material having a perovskite structure represented by general formula $ABO_3$. Note that the perovskite structure may contain $ABO_{3-\alpha}$ outside the stoichiometry. Examples of the ceramic material having a perovskite structure include a material containing barium (Ba) and titanium (Ti), typified by barium titanate ($BaTiO_3$). Specifically, $Ba_{1-x-y}Ca_xSr_yTi_{1-z}Zr_zO_3$ ($0 \le x \le 1$, $0 \le y \le 1$, $0 \le z \le 1$) is included, for example.

Note that the dielectric ceramics may have a composition system of strontium titanate ($SrTiO_3$), calcium titanate ($CaTiO_3$), magnesium titanate ($MgTiO_3$), calcium zirconate ($CaZrO_3$), calcium zirconate titanate ($Ca(Ti, Zr)O_3$), barium calcium titanate zirconate ($(Ba, Ca)(Ti, Zr)O_3$), barium zirconate ($BaZrO_3$), titanium oxide ($TiO_2$), or the like.

2. BASIC CONFIGURATION OF FIRST AND SECOND EXTERNAL ELECTRODES 13A AND 13B

With reference to FIGS. 2 and 3, the outer shape of the first and second external electrodes 13a and 13b will be described. In the following description of the first and second external electrodes 13a and 13b, the first external electrode 13a on the first end surface E1 will be mainly described, but the second external electrode 13b on the second end surface E2 is also configured in a similar manner.

The first external electrode 13a includes an end-surface-covering portion 13e that covers the first end surface E1, a pair of main-surface-covering portions 13m that cover part of the first and second main surfaces M1 and M2, and a pair of side-surface-covering portions 13s that cover part of the first and second side surfaces S1 and S2. The main-surface-covering portions 13m are formed to be continuous from the end-surface-covering portion 13e to cover part of the first and second main surfaces M1 and M2. The side-surface-covering portions 13s are formed to be continuous from the end-surface-covering portion 13e to cover part of the first and second side surfaces S1 and S2.

Further, each of the first and second external electrodes 13a and 13b has a laminated structure including a base layer 14, a conductive resin layer 15, and a plating layer 16.

The base layer 14 is formed on the ceramic body 11 and is located at least on the end-surface-covering portion 13e. With this configuration, the base layer 14 is electrically connected to the internal electrodes 12a or 12b. In this embodiment, the base layer 14 extends from the end-surface-covering portion 13e to part of the main-surface-covering portions 13m and side-surface-covering portions 13s. In this embodiment, the base layer 14 is configured as a sintered metal film obtained by baking a conductive metal paste. By way of example, the main component of the base layer 14 can be any one of nickel (Ni), copper (Cu), palladium (Pd), and silver (Ag). Further, for example, the base layer 14 may have a double-layer structure in which a plating layer made of copper (Cu) or the like is formed on a sintered metal film mainly containing nickel (Ni).

The conductive resin layer 15 covers the base layer 14 and, in this embodiment, extends from the end-surface-covering portion 13e to the main-surface-covering portions 13m and the side-surface-covering portions 13s. So, the main-surface-covering portions 13m include the conductive resin layer 15. In the main-surface-covering portions 13m, the conductive resin layer 15 covers the base layer 14 and also extends toward the center in the X-axis direction beyond the base layer 14. In other words, in the region adjacent to the center of each main-surface-covering portion 13m in the X-axis direction, the conductive resin layer 15 comes into direct contact with the main surface M1 or M2 of the ceramic body 11. The conductive resin layer 15 is based on a resin having flexibility, and thus has a higher flexibility and deflection strength than the base layer 14 and the plating layer 16.

The conductive resin layer 15 includes, for example, a resin and a conductive material. Examples of the resin include a thermosetting resin. Examples of the thermosetting resin include a phenol resin, an acrylic resin, a silicone resin, an epoxy resin, and a polyimide resin. Examples of the conductive material include metal powder (conductive filler) including particles with a spherical shape or flattened shape. Examples of the metal powder include Ag powder and Cu powder. In addition to the above components, the conductive resin layer 15 may contain other components such as organic solvents and curing agents.

The plating layer 16 covers the conductive resin layer 15 to form the superficial layer of the end-surface-covering portion 13e, the main-surface-covering portions 13m, and the side-surface-covering portions 13s. The plating layer 16 is, for example, formed on the conductive resin layer 15 by a wet plating method. The plating layer 16 has a single-layer or multi-layer structure mainly containing any one of Ni, Cu, Sn, Pd, and Ag.

With such a configuration, the main-surface-covering portions 13m of this embodiment include the conductive resin layer 15 having a high flexibility. For example, the first and second external electrodes 13a and 13b of the multi-layer ceramic capacitor 10 are soldered onto a mounting substrate 110 with the main-surface-covering portion 13m on the first main surface M1 facing the mounting substrate 110, thus forming a circuit board 100.

3. CONFIGURATION OF CIRCUIT BOARD 100

Figure 4:
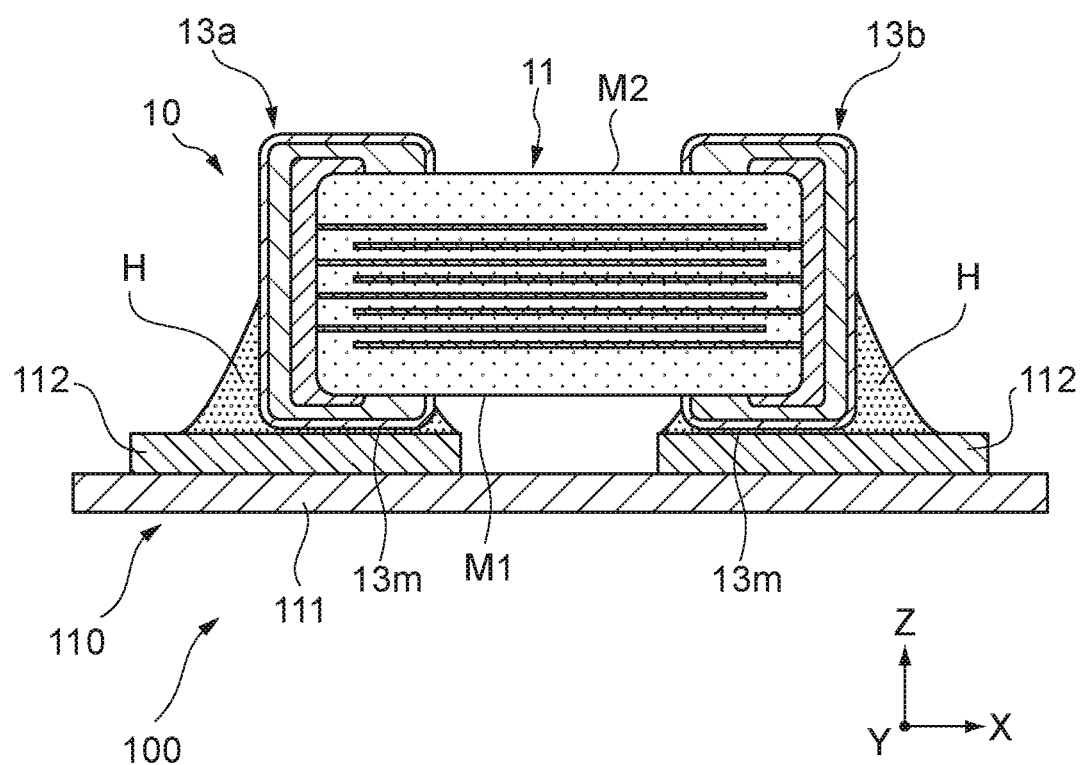
FIG. 4 is a cross-sectional view of a circuit board on which the multi-layer ceramic capacitor is mounted.

As shown in FIG. 4, the circuit board 100 includes the multi-layer ceramic capacitor 10 and the mounting substrate 110.

The mounting substrate 110 includes a substrate body 111 extending along the X-Y plane, and connection electrodes 112 provided on the substrate body 111. The two connection electrodes 112 are disposed corresponding to the first and second external electrodes 13a and 13b of the multi-layer ceramic capacitor 10.

In the production process of the circuit board 100, first, solder H is disposed on each of the connection electrodes 112 of the mounting substrate 110. The multi-layer ceramic capacitor 10 is disposed on the mounting substrate 110 in a state where the first main surface M1 of the ceramic body 11 faces the mounting substrate 110 and the positions of the first and second external electrodes 13a and 13b are aligned with the positions of the connection electrodes 112. Thus, the main-surface-covering portions 13m of the first and second external electrodes 13a and 13b are disposed facing the connection electrodes 112.

The mounting substrate 110 on which the multi-layer ceramic capacitor 10 is disposed is heated in a reflow furnace or the like, to melt the solder H on the connection electrodes 112. Thus, the solder H in the molten state wets and spreads along the surfaces of the connection electrodes 112 of the mounting substrate 110 and the first and second external electrodes 13a and 13b of the multi-layer ceramic capacitor 10. When the solder H is cooled and solidified, the multi-layer ceramic capacitor 10 is connected to the mounting substrate 110.

The circuit board 100 thus produced is mounted in an electronic apparatus such as in-vehicle equipment. If the circuit board 100 is used in an environment where vibration or temperature change is large, such as the in-vehicle equipment, the mounting substrate 110 may be repeatedly deflected and deformed.

Figure 5:
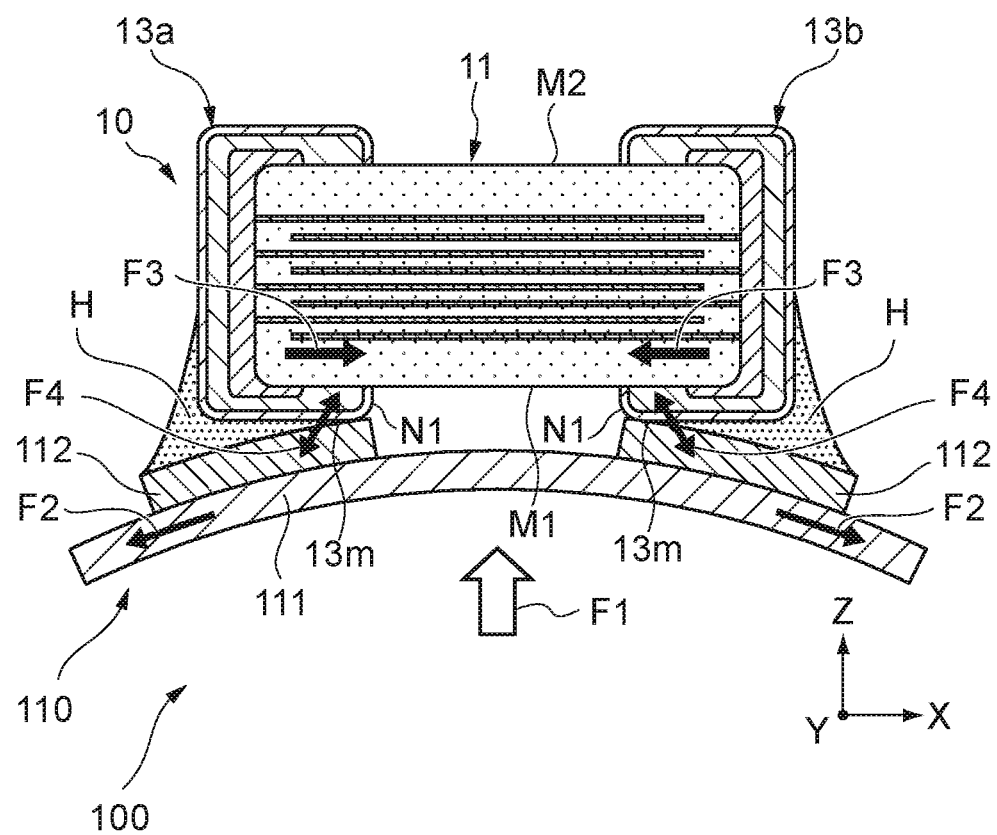
FIG. 5 is a cross-sectional view of the circuit board, showing a form in which the circuit board is deflected.

FIG. 5 is a schematic cross-sectional view showing a form in which the circuit board 100 is deflected and deformed.

As shown in the figure, the circuit board 100 receives, for example, an upward force F1 in the Z-axis direction along with the deformation due to the vibration or temperature change of the electronic apparatus in which the circuit board 100 is mounted. Thus, the circuit board 100 is deflected and deformed upward in the Z-axis direction into a convex shape, and, for example, an outward stress F2 in the X-axis direction along the substrate body 111 is caused in the circuit board 100.

Meanwhile, the multi-layer ceramic capacitor 10 is less likely to be deflected than the mounting substrate 110. Hence, a stress F3 toward the center in the X-axis direction is caused in the multi-layer ceramic capacitor 10 connected to the mounting substrate 110.

Along with the stress F2 and stress F3, the main-surface-covering portions 13m, which are the connection portions of the multi-layer ceramic capacitor 10 to the mounting substrate 110, cause a stress F4 in the direction intersecting with the Z-axis direction and the X-axis direction. In each of the first and second external electrodes 13a and 13b, the conductive resin layer 15 has flexibility, and thus the conductive resin layer 15 of each main-surface-covering portion 13m may expand and contract along with the stress F4. As a result, the influence of the stress F4 can be mitigated.

Meanwhile, under severe environments where temperature change is very large and a large stress F4 is particularly likely to occur, even a conventional multi-layer ceramic capacitor including the external electrode including the conductive resin layer has caused peel-off of the external electrode. Hereinafter, as a comparison example of this embodiment, a configuration of a main-surface-covering portion of a conventional multi-layer ceramic capacitor will be described.

Figure 6:
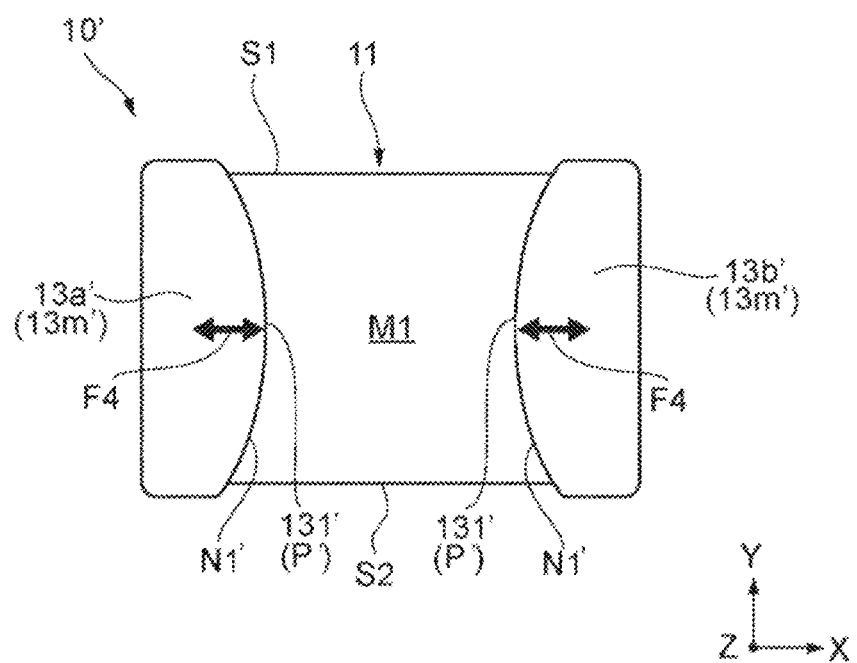
FIG. 6 is a plan view of the multi-layer ceramic capacitor according to a comparison example of this embodiment as viewed from a first main surface in a first axis direction.

FIG. 6 is a plan view of a multi-layer ceramic capacitor 10' according to a comparison example of this embodiment as viewed from a first main surface M1. External electrodes 13a' and 13b' of the multi-layer ceramic capacitor 10' each include main-surface-covering portions 13m' including a conductive resin layer 15 (not shown in FIG. 6).

In the external electrodes 13a' and 13b' of the multi-layer ceramic capacitor 10', an inner edge N1' of the main-surface-covering portion 13m', which is adjacent to the center in the X-axis direction, has a shape convexly curved toward the center in the X-axis direction. In other words, the main-surface-covering portion 13m' includes a single convex portion 131' swelling in the X-axis direction.

In the production process of the multi-layer ceramic capacitor 10, if the conductive resin layer 15 is formed by immersing the multi-layer ceramic capacitor 10 into a resin paste from each of the first and second end surfaces E1 and E2 (see Step S33 to be described later), the surface tension on the first and second main surfaces M1 and M2 makes the resin paste easily wet and spread upward at the center portion in the Y-axis direction. Thus, the main-surface-covering portion 13m' having the shape as shown in FIG. 6 is formed.

The inventors of the present disclosure have found that the convex portion 131' peels off from the ceramic body 11 and a bad connection between the external electrodes 13a' and 13b' and the mounting substrate 110 occurs under a severe environment. This is probably because the stress F4, for which the flexibility of the conductive resin layer 15 cannot compensate, concentrates at the top P' of the convex portion 131'.

From the viewpoint of effectively suppressing the concentration of the stress F4, this embodiment provides the main-surface-covering portion 13m having the following configuration.

4. DETAILED CONFIGURATION OF FIRST AND SECOND EXTERNAL ELECTRODES 13A AND 13B

Figure 7:
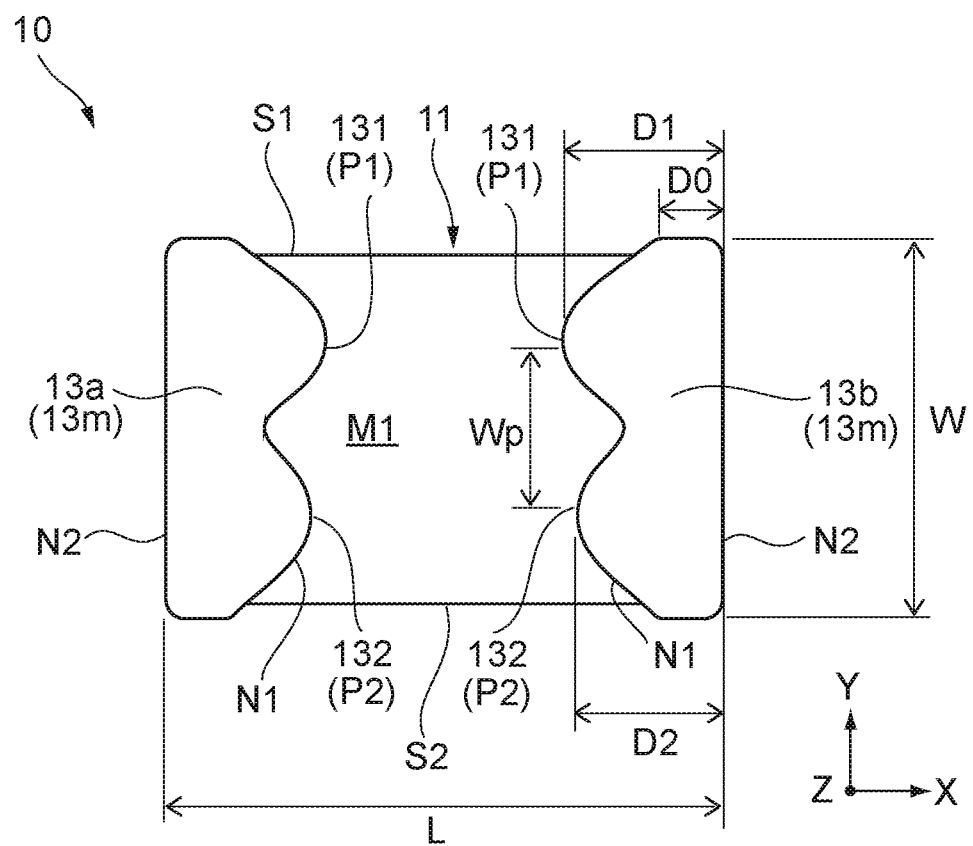
FIG. 7 is a plan view of the multi-layer ceramic capacitor of this embodiment as viewed from a first main surface in the first axis direction.

FIG. 7 is a plan view of the multi-layer ceramic capacitor 10 as viewed from the first main surface M1.

In this embodiment, the main-surface-covering portion 13m includes a first convex portion 131 and a second convex portion 132, which swell toward the center in the X-axis direction and are disposed apart from each other in the Y-axis direction.

Note that in this embodiment the main-surface-covering portion 13m on the second main surface M2 is also configured in a similar manner.

The first convex portion 131 includes a first top P1. The first top P1 is a portion most adjacent to the center in the X-axis direction in the first convex portion 131.

The second convex portion 132 includes a second top P2. The second top P2 is a portion most adjacent to the center in the X-axis direction in the second convex portion 132.

Note that if the first and second tops P1 and P2 are located at different positions in the X-axis direction as shown in FIG. 7, the convex portion including the top more adjacent to the center in the X-axis direction is defined as "the first convex portion 131".

In the main-surface-covering portion 13m, an inner edge N1 adjacent to the center in the X-axis direction has an irregular shape including the two first and second tops P1 and P2 resulting from the first and second convex portions 131 and 132. Note that an outer edge of the main-surface-covering portion 13m in the X-axis direction is referred to as an outer edge N2.

The first and second convex portions 131 and 132 have a shape defined by the shape of the conductive resin layer 15. In other words, the conductive resin layer 15 includes two convex portions (see FIG. 13C), and the first and second convex portions 131 and 132 are formed on the basis of the shape of the conductive resin layer 15.

Figure 8:
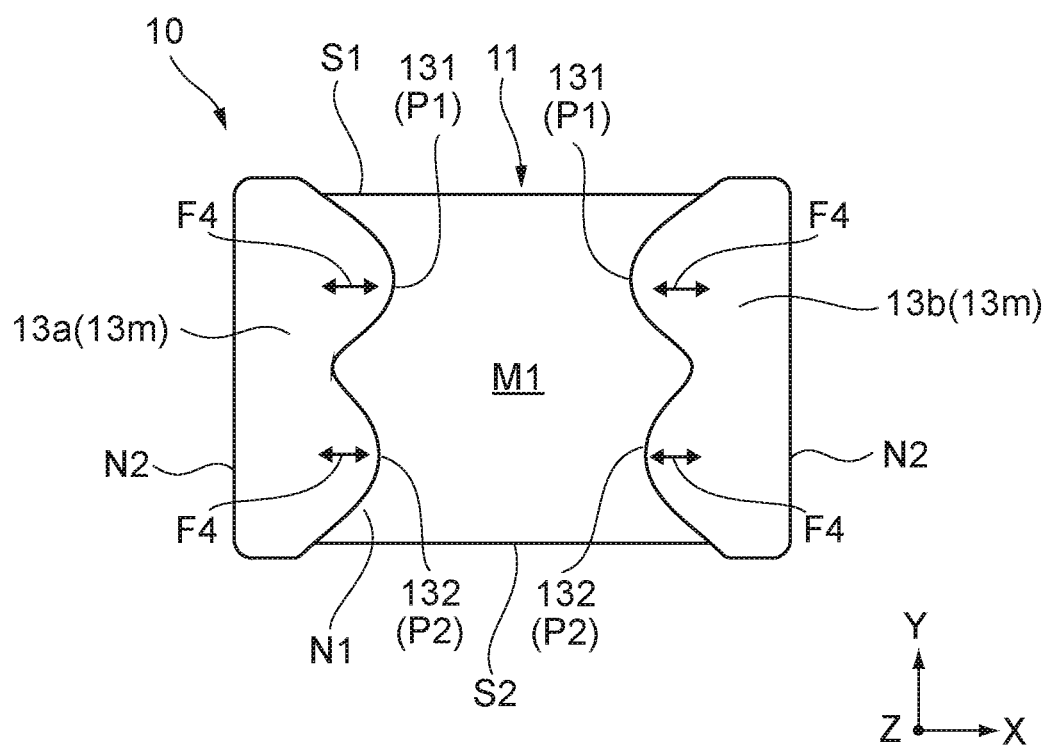
FIG. 8 is a plan view of the multi-layer ceramic capacitor as viewed from the first axis direction as shown similarly in FIG. 7, for describing the distribution of stress.

As shown in FIG. 8, since the multi-layer ceramic capacitor 10 of this embodiment includes the main-surface-covering portion 13m including the first and second convex portions 131 and 132, the stress F4 can be distributed to the first and second tops P1 and P2. In other words, the stress F4 can be prevented from locally concentrating. This makes it possible to reduce the magnitude of the stress F4 caused at each of the first and second tops P1 and P2 as compared to the magnitude of the stress F4 caused at the top P' of the comparison example. Therefore, the main-surface-covering portion 13m can be prevented from peeling off from the ceramic body 11 due to the stress F4. As a result, a bad connection between the first and second external electrodes 13a and 13b and the mounting substrate 110 can be suppressed.

In addition, since the main-surface-covering portion 13m includes the first and second convex portions 131 and 132, the length of the conductive resin layer 15 in the X-axis direction can be satisfactorily ensured. This makes it possible to extend the region where the flexibility can be exerted. Therefore, the main-surface-covering portion 13m can be more effectively prevented from peeling off from the ceramic body 11.

Further, it is favorable that the first and second convex portions 131 and 132 have a laminated structure including the conductive resin layer 15 and the plating layer 16 with reference to FIG. 2. In other words, it is favorable that the first and second convex portions 131 and 132 include the conductive resin layer 15 that comes into direct contact with the ceramic body 11 without interposing the base layer 14 having a low flexibility. With this configuration, even if the first and second convex portions 131 and 132 cause the stress F4, the effect of mitigating the stress by the conductive resin layer 15 suppresses propagation of the stress F4 to the ceramic body 11. Therefore, cracks are also effectively prevented from being generated in the ceramic body 11. Further, the conductive resin layer 15 enhances the adhesion of the first and second convex portions 131 and 132 to the ceramic body 11, and thus the first and second convex portions 131 and 132 can be more effectively prevented from peeling off from the ceramic body 11.

Further, from the viewpoint of more reliably preventing the main-surface-covering portion 13m from peeling off, the dimension of each portion of the main-surface-covering portion 13m can be set as follows. Note that FIG. 7 shows the dimension of the main-surface-covering portion 13m of the second external electrode 13b, but the main-surface-covering portion 13m of the first external electrode 13a can also be configured in a similar manner.

As shown in FIG. 7, the dimension of the main-surface-covering portion 13m in the X-axis direction from the outer edge N2, which is located outward in the X-axis direction, to the first top P1 is referred to as a first peak dimension D1. The dimension of the main-surface-covering portion 13m in the X-axis direction from the outer edge N2 to the second top P2 is referred to as a second peak dimension D2.

Further, the dimension of the narrowest portion of the main-surface-covering portion 13m in the X-axis direction from the outer edge N2 to the inner edge N1 is referred to as a minimum dimension DO of the main-surface-covering portion 13m in the X-axis direction. The portion to have the minimum dimension DO may be located outward in the Y-axis direction relative to the first convex portion 131 and the second convex portion 132 in the main-surface-covering portion 13m. Alternatively, such a portion may be located between the first convex portion 131 and the second convex portion 132. The minimum dimension DO is, for example, substantially equal to the dimension of the base layer 14 in the X-axis direction of the main-surface-covering portion 13m.

For example, it is favorable that each of the first peak dimension D1 and the second peak dimension D2 is 1.5 times or more the minimum dimension DO. This makes it possible to sufficiently swell the first and second convex portions 131 and 132 from the portion having the minimum dimension DO. Therefore, the effect of distributing the stress in the first and second convex portions 131 and 132 can be reliably exerted.

Further, this makes it possible to sufficiently ensure the length of the first convex portion 131 and the second convex portion 132 that can exert the flexibility against the stress F4. In addition, the adhesion of the main-surface-covering portion 13m to the ceramic body 11 can be sufficiently ensured. Therefore, the above configuration can more effectively prevent the main-surface-covering portion 13m from peeling off from the ceramic body 11.

Further, it is favorable that each of the first peak dimension D1 and the second peak dimension D2 is four times or less the minimum dimension DO. This configuration can prevent the first and second external electrodes 13a and 13b from coming into contact with each other and from being electrically connected to each other. Further, this configuration can reduce the amount of use of the conductive resin and also prevent the shape of the first and second convex portions 131 and 132 from being excessively sharp, thus facilitating the production.

Further, it is favorable that each of the first peak dimension D1 and the second peak dimension D2 is 1/10 or more and 2/5 or less of the dimension L of the multi-layer ceramic capacitor 10 in the X-axis direction.

If the first and second peak dimensions D1 and D2 are 1/10 or more of the dimension L, the length of the first convex portion 131 and the second convex portion 132 that can exert the flexibility against the stress F4 can be sufficiently ensured, and the adhesion of the main-surface-covering portion 13m to the ceramic body 11 can be sufficiently ensured. If the first and second peak dimensions D1 and D2 are 2/5 or less of the dimension L, the first and second external electrodes 13a and 13b can be more reliably prevented from coming into contact with each other and being electrically connected to each other.

Further, it is favorable that the first peak dimension D1 is larger than the second peak dimension D2.

As described above, a larger peak dimension is more advantageous from the viewpoint of the mitigation of the stress F4 and the adhesion to the ceramic body 11. In view of this, the first and second convex portions 131 and 132 having different first and second peak dimensions D1 and D2 are formed, and the first peak dimension D1 of the first convex portion 131 is formed to be larger, so that the effects of the mitigation of the stress F4 and the adhesion to the ceramic body 11 in the first convex portion 131 can be enhanced more. Further, as compared to the case where both the first and second peak dimensions D1 and D2 are formed to be longer, it is possible to suppress a risk of an electrical conduction between the first and second external electrodes 13a and 13b. Further, the amount of use of the conductive resin can also be reduced, and the shape of the first and second convex portions 131 and 132 is prevented from being excessively sharp, so that the production thereof is facilitated.

In particular, the first peak dimension D1 is set to 1.1 times or more the second peak dimension D2, so that the above-mentioned operative effect can be obtained more reliably. Further, the first peak dimension D1 is set to 1.5 times or less the second peak dimension D2, so that the shape of the first convex portion 131 is prevented from being excessively sharp, which is more advantageous from the viewpoint of the production. Further, the balance of the stress F4 caused in the first and second convex portions 131 and 132 can be maintained, and the risk that the multi-layer ceramic capacitor 10 falls over on the mounting substrate 110 can be suppressed.

Further, from the viewpoint of more reliably distributing the stress F4, it is favorable that the first top P1 and the second top P2 are set apart from each other to some extent. For example, a separation distance Wp in the Y-axis direction between the first top P1 and the second top P2 is favorably 1/5 or more and 1/2 or less of the dimension W of the multi-layer ceramic capacitor 10 in the Y-axis direction.

The separation distance Wp is set to 1/5 or more of the dimension W, so that the stress F4 can be prevented from concentrating at close positions. This makes it possible to more reliably provide the effect of distributing the stress F4 and preventing the main-surface-covering portion 13m from peeling off.

The separation distance Wp is set to 1/2 or less of the dimension W, so that the first and second convex portions 131 and 132 can be prevented from being disposed outward in the Y-axis direction. Thus, the stress F4 is difficult to unevenly cause outward in the Y-axis direction, and the risk that the multi-layer ceramic capacitor 10 falls over due to the stress F4 caused in the first and second convex portions 131 and 132 can be suppressed. Therefore, the circuit board 100 can maintain a stable mounting state.

5. PRODUCTION METHOD FOR MULTI-LAYER CERAMIC CAPACITOR 10

Figure 9:
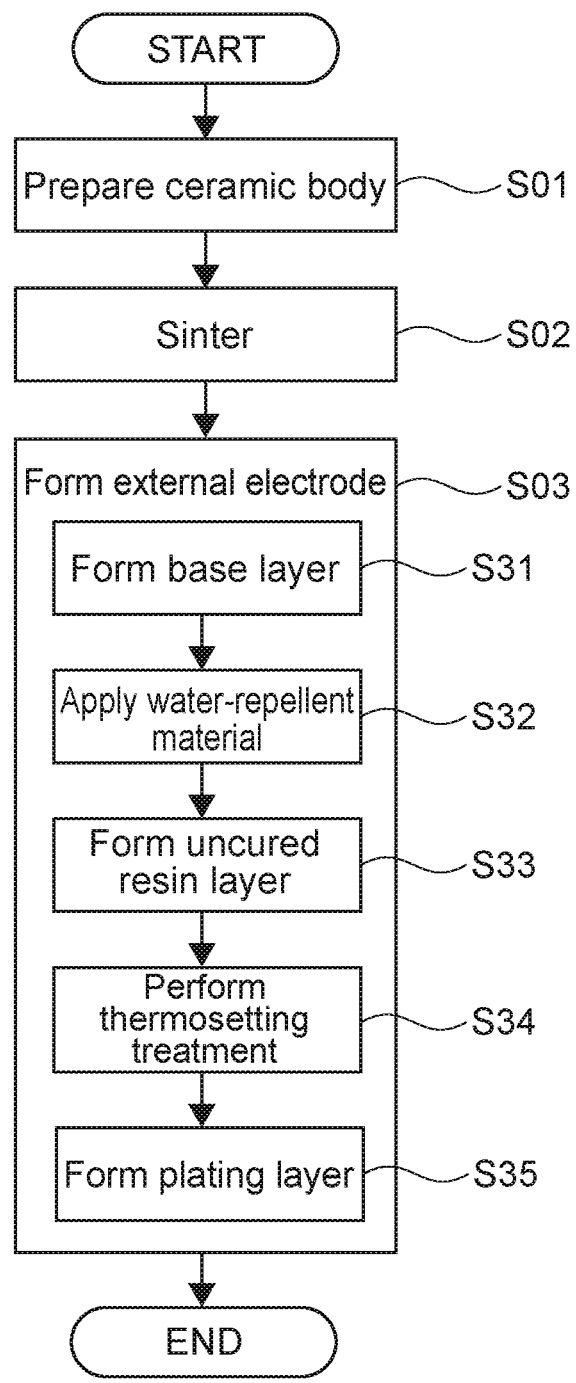
FIG. 9 is a flowchart showing a production method for the multi-layer ceramic capacitor.

FIG. 9 is a flowchart showing an example of a production method for the multi-layer ceramic capacitor 10 according to this embodiment. FIGS. 10 to 13C are views showing a production process of the multi-layer ceramic capacitor 10. Hereinafter, the production method for the multi-layer ceramic capacitor 10 will be described according to FIG. 9 with reference to FIGS. 10 to 13C as appropriate.

5.1 Step S01: Preparation of Ceramic Body

In Step S01, an unsintered ceramic body 11 is prepared. The unsintered ceramic body 11 is obtained by laminating and thermocompression-bonding a plurality of ceramic sheets in the Z-axis direction. By printing a conductive metal paste of a predetermined pattern on the ceramic sheets in advance, the first and second internal electrodes 12a and 12b can be arranged.

The ceramic sheet is an unsintered dielectric green sheet obtained by forming ceramic slurry into a sheet shape. The ceramic sheet is formed into a sheet shape by using a roll coater or a doctor blade, for example. Components of the ceramic slurry are adjusted so as to obtain a ceramic body 11 with a predetermined composition.

5.2 Step S02: Sintering

Figure 10:
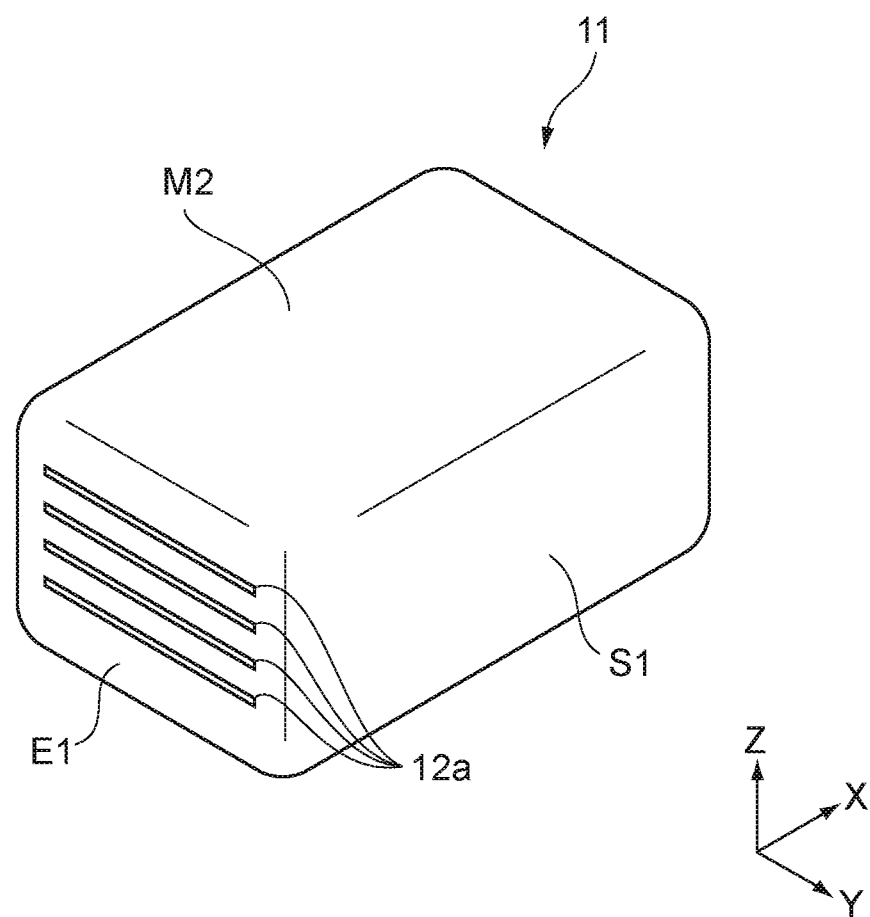
FIG. 10 is a perspective view of a ceramic body obtained in Step S02.

In Step S02, the unsintered ceramic body 11 obtained in Step S01 is sintered. As a result, the ceramic body 11 is sintered, and the ceramic body 11 shown in FIG. 10 is obtained. Sintering of the ceramic body 11 can be performed in a reduction atmosphere or a low-oxygen partial pressure atmosphere, for example. The sintering conditions of the ceramic body 11 can be appropriately determined.

5.3 Step S03: Formation of External Electrodes

In Step S03, the first and second external electrodes 13a and 13b are formed on the ceramic body 11 obtained in Step S02. Thus, the multi-layer ceramic capacitor 10 shown in FIGS. 1 to 3 is completed. Step S03 includes five steps of Step S31, Step S32, Step S33, Step S34, and Step S35.

5.3.1 Step S31: Formation of Base Layers

In Step S31, base layers 14 of the first and second external electrodes 13a and 13b are formed on the ceramic body 11. The base layers 14 are formed by, for example, applying a conductive metal paste Ps1 mainly containing Ni or Cu onto the first and second end surfaces E1 and E2 and baking them.

Figure 11A:
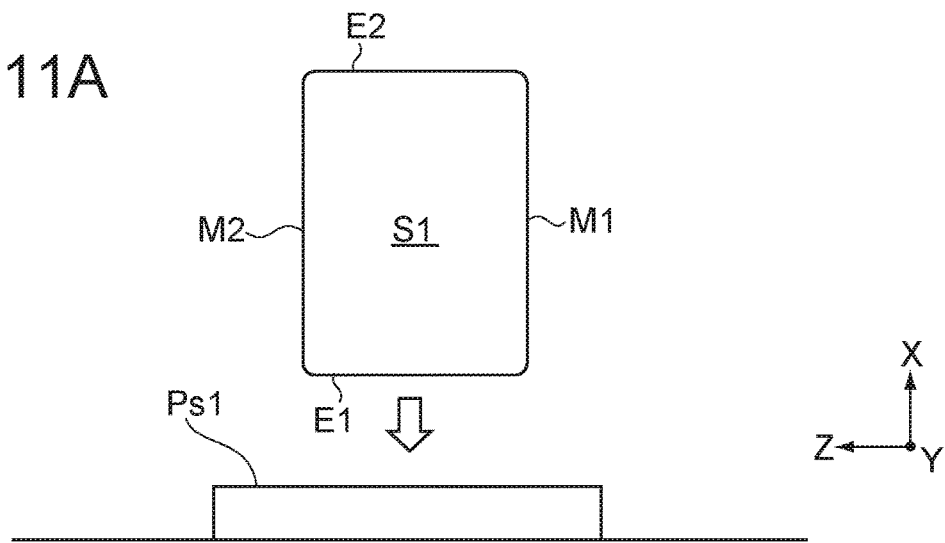
FIG. 11A is a view showing Step S31.
Figure 11B:
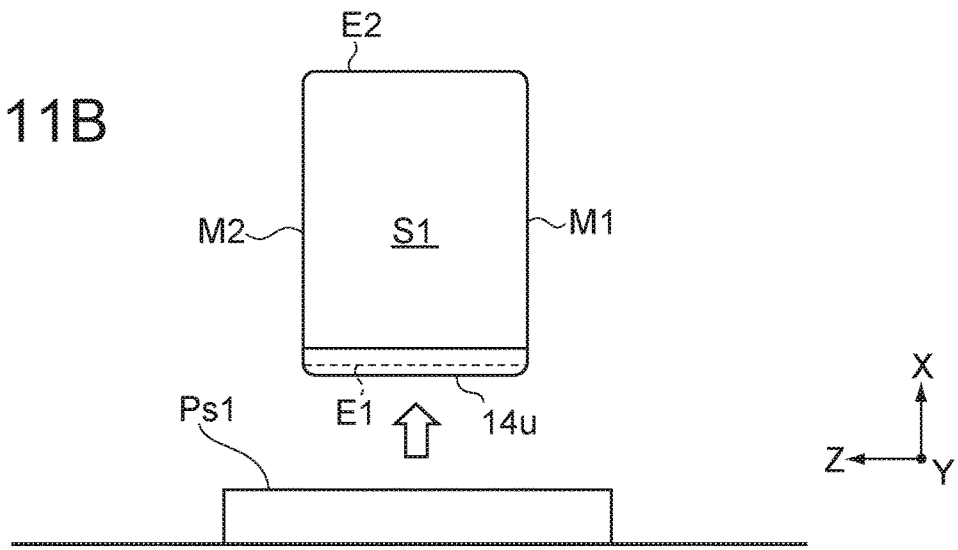
FIG. 11B is a view showing Step S31.
Figure 11C:
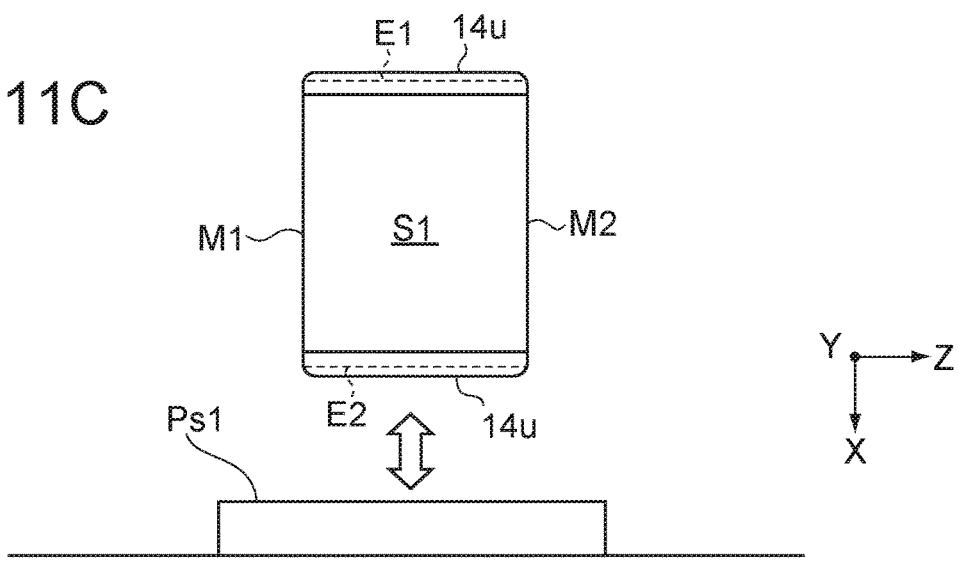
FIG. 11C is a view showing Step S31.

FIGS. 11A to 11C show the process of forming base layers 14u made of the conductive metal paste Ps1 on the ceramic body 11 in Step S31. First, as shown in FIG. 11A, the ceramic body 11 is immersed into the conductive metal paste Ps1 from the first end surface E1 to cause the conductive metal paste Ps1 to adhere to the ceramic body 11.

Thus, as shown in FIG. 11B, an unsintered base layer 14$u$ that covers a portion of the ceramic body 11 on the first end surface E1 is formed.

Similarly, as shown in FIG. 11C, the ceramic body 11 is immersed into the conductive metal paste Ps1 from the second end surface E2, and an unsintered base layer 14$u$ is formed on the second end surface E2 similarly to the first end surface E1.

Note that the immersing condition in Step S31 can be appropriately determined. For example, the depth at which the ceramic body 11 is immersed into the conductive metal paste Ps1 can be set to the depth corresponding to the dimension of the base layer 14 in the X-axis direction after baking. Further, the base layer 14$u$ obtained after immersion can be dried under a predetermined condition.

Subsequently, the unsintered base layers 14$u$ formed on the ceramic body 11 are baked by heat treatment. Thus, the base layers 14 that are sintered films are formed on the ceramic body 11. If the formation of the base layers 14$u$ in Step S31 is performed before Step S02, sintering of the ceramic body 11 in Step S02 and baking of the base layers 14$u$ in Step S31 can be performed by one time of heat treatment.

5.3.2 Step S32: Application of Water-Repellent Material

In Step S32, a water-repellent material is applied to the first and second main surfaces M1 and M2 of the ceramic body 11 on which the base layers 14 are formed. Examples of the water-repellent material include materials containing a water-repellent component, such as a fluorine compound and a silicon compound. Thus, in the following Step S33 of the formation of an uncured resin layer, the conductive resin paste can be controlled to wet and spread upward, so that the first and second convex portions 131 and 132 can be formed.

In this step, first, the ceramic body 11 on which the base layers 14 are formed is masked such that a region to be coated with a water-repellent material is exposed. Subsequently, the water-repellent material is applied to the region exposed from the mask. The method of applying the water-repellent material is not particularly limited. For example, a spray method, a sputtering method, a dip method, and the like can be used. Alternatively, if the water-repellent material contains a silicon-based component, a heated silicon chip is brought into contact with the portion exposed from the mask to be applied thereto.

After the mask is removed, the ceramic body 11 coated with the water-repellent material on the first main surface M1 is obtained. Further, the second main surface M2 can also be coated with the water-repellent material.

Figure 12:
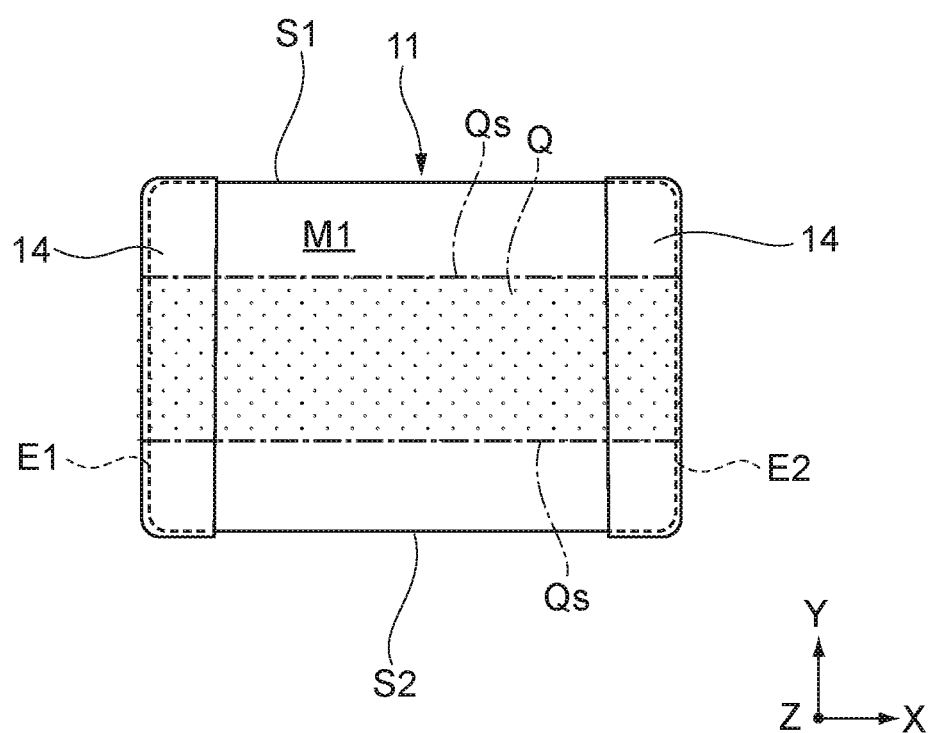
FIG. 12 is a view showing Step S32.

FIG. 12 schematically shows a water-repellent region Q of the first main surface M1, in which the water-repellent material is applied.

The water-repellent region Q is set as a strip-shaped region along the X-axis direction, which is located at the center portion of the first main surface M1 in the Y-axis direction. The width of the water-repellent region Q in the Y-axis direction is set to a width of approximately 0.3 to 1 times the separation distance Wp between the first and second tops P1 and P2. Lateral edges Qs of the water-repellent region Q arranged in the Y-axis direction are located at positions passing through the inner side in the Y-axis direction of the first and second tops P1 and P2 of the first and second convex portions 131 and 132 to be produced later. The length of the water-repellent region Q in the X-axis direction only needs to be the length that reaches the recess between the first and second convex portions 131 and 132 to be produced later, and may be, for example, across the whole length in the X-axis direction of the first main surface M1 including the base layers 14.

Note that the water-repellent region Q can also be formed on the second main surface M2.

5.3.3 Step S33: Formation of Uncured Resin Layers

In Step S33, uncured resin layers 15$u$ constituting the conductive resin layers 15 are formed on the ceramic body 11 on which the base layers 14 and the water-repellent region Q are formed. The uncured resin layer 15$u$ is formed using an uncured resin paste Ps2 containing a conductive material. Examples of the uncured resin paste Ps2 include a paste-like thermosetting resin and metal powder. In addition, the uncured resin paste Ps2 may contain other components such as organic solvents and curing agents.

Figure 13A:
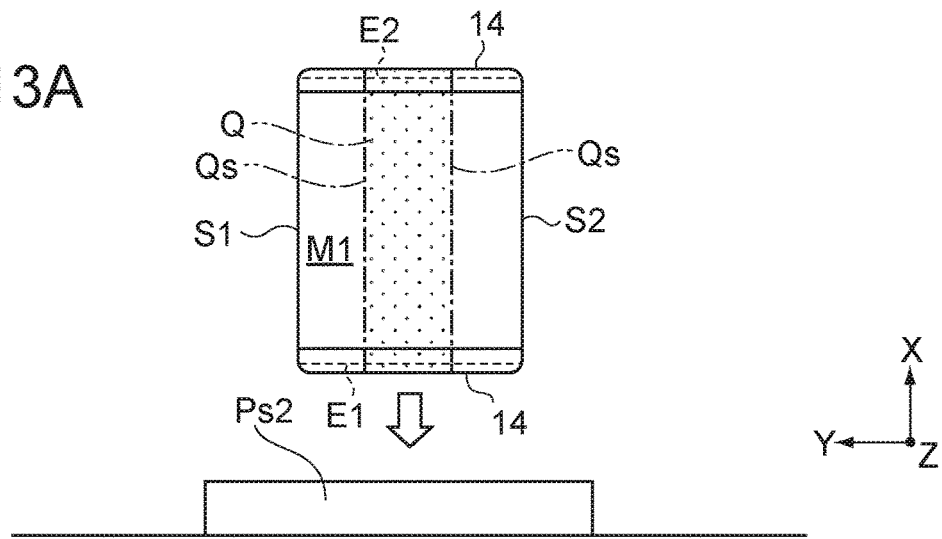
FIG. 13A is a view showing Step S33.
Figure 13B:
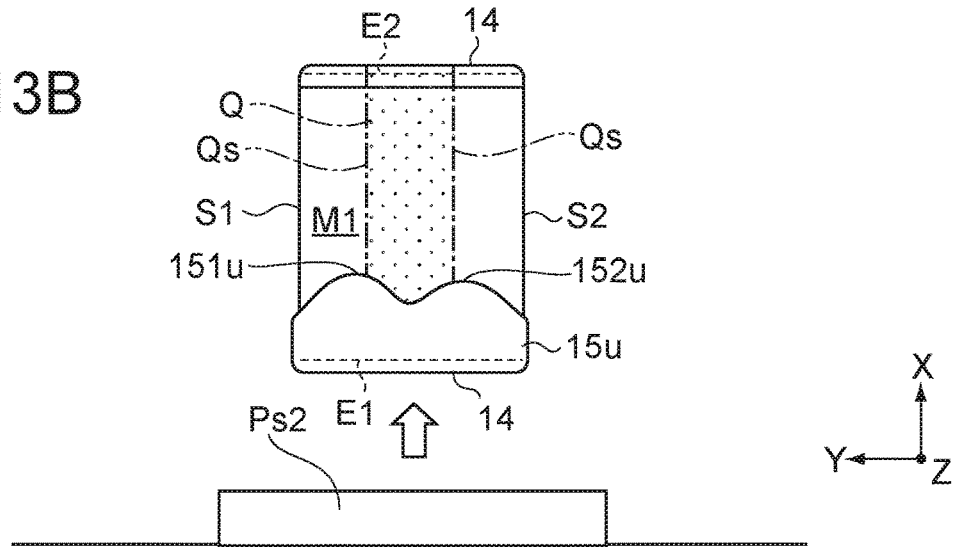
FIG. 13B is a view showing Step S33.
Figure 13C:
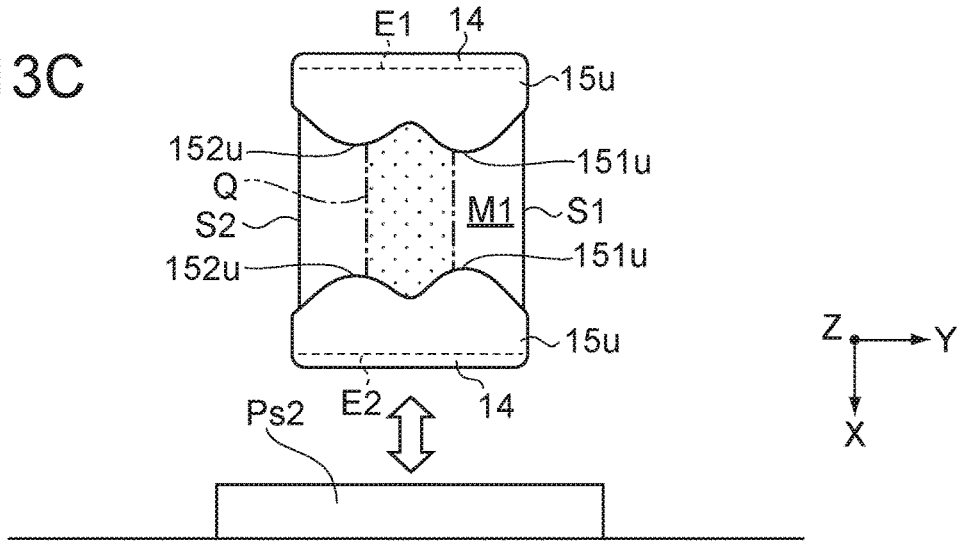
FIG. 13C is a view showing Step S33.

FIGS. 13A to 13C show the process of forming the uncured resin layers 15$u$ on the ceramic body 11 in Step S33.

First, as shown in FIG. 13A, the ceramic body 11 is immersed into the uncured resin paste Ps2 from the first end surface E1 to the position where the base layer 14 is covered, and the uncured resin paste Ps2 is caused to adhere to the ceramic body 11.

The uncured resin paste Ps2 that has adhered to the ceramic body 11 wets and spreads upward in the X-axis direction from the first end surface E1 to the first and second main surfaces M1 and M2 and the first and second side surfaces S1 and S2. In particular, the uncured resin paste Ps2 tends to wet and spread upward to a large extent at the center portion in the Y-axis direction due to the surface tension. In this embodiment, the water-repellent region Q is formed at the center portion in the Y-axis direction on each of the first and second main surfaces M1 and M2. So, the uncured resin paste Ps2 is difficult to wet and spread upward on the water-repellent region Q and thus wets and spreads along its lateral edges in the Y-axis direction to a large extent. As a result, as shown in FIG. 13B, the uncured resin layer 15$u$ is formed, which extends from the first end surface E1 along the first and second main surfaces M1 and M2 and the first and second side surfaces S1 and S2 and includes a first convex portion 151$u$ and a second convex portion 152$u$ on each of the first and second main surfaces M1 and M2.

Similarly, as shown in FIG. 13C, the ceramic body 11 is immersed into the uncured resin paste Ps2 from the second end surface E2 to the position where the base layer 14 is covered. Thus, an uncured resin layer 15$u$ including a first convex portion 151$u$ and a second convex portion 152$u$ is also formed on the second end surface E2 similarly to the first end surface E1.

In this technique, adjusting the positions of the lateral edges Qs of the water-repellent region Q makes it possible to adjust the positions of the first and second tops P1 and P2 corresponding thereto. For example, when the lateral edges Qs of the water-repellent region Q are shifted outward in the Y-axis direction, the positions of the first and second tops P1 and P2 are close to the first and second side surfaces S1 and S2.

Further, adjusting the dimension of the water-repellent region Q in the Y-axis direction makes it possible to adjust the separation distance Wp between the first and second tops P1 and P2, and the first and second peak dimensions D1 and D2. For example, as the dimension of the water-repellent region Q in the Y-axis direction becomes narrower, the separation distance Wp becomes narrower, and the first and second peak dimensions D1 and D2 become larger.

Further, in order to form the first peak dimension D1 to be larger than the second peak dimension D2, for example, the water-repellent region Q can be disposed to be biased toward the first side surface S1 or the second side surface S2. The uncured resin paste Ps2 wets and spreads upward to a large extent along the lateral edge Qs of the water-repellent region Q, which is located more adjacent to the center in the Y-axis direction. One of the lateral edges Qs of the water-repellent region Q is disposed adjacent to the center in the Y-axis direction relative to the other lateral edge Qs, so that the magnitude of the first peak dimension D1 and the second peak dimension D2 can be varied. Further, the amount of the water-repellent material applied to the water-repellent region Q is made uneven, so that the magnitude of the first peak dimension D1 and the second peak dimension D2 can be varied. The peak dimension with the larger amount of the water-repellent material applied becomes smaller. Further, if the amount of the water-repellent material applied to the entire water-repellent region Q is increased, a large recess between the first and second tops P1 and P2 can be formed, and if the amount is reduced, a small recess can be formed.

The first and second peak dimensions D1 and D2 can also be adjusted depending on the depth in the X-axis direction at which the ceramic body 11 is immersed into the uncured resin paste Ps2. By way of example, the depth at which the ceramic body 11 is immersed into the uncured resin paste Ps2 can be set to the depth equal to the dimension of the base layer 14 in the X-axis direction. This makes it possible to keep the minimum dimension DO to the dimension of the base layer 14 in the X-axis direction. Note that as the depth in the X-axis direction at which the ceramic body 11 is immersed into the uncured resin paste Ps2 becomes larger, the first and second peak dimensions D1 and D2 become larger. In this technique, the minimum dimension DO also increases.

The first and second peak dimensions D1 and D2, and the ratio of each of the first and second peak dimensions D1 and D2 to the minimum dimension DO (D1/DO, D2/DO) can also be adjusted depending on the physical property of the uncured resin paste Ps2. For example, use of the uncured resin paste Ps2 having a high solder wettability to the ceramic body 11 makes it possible to promote wetting and spreading upward of the uncured resin paste Ps2 after immersion and to increase the first and second peak dimensions D1 and D2 and the above-mentioned ratios (D1/DO, D2/DO). Further, reducing the viscosity of the uncured resin paste Ps2 also makes it possible to promote wetting and spreading upward of the uncured resin paste Ps2 and to increase the first and second peak dimensions D1 and D2 and the above-mentioned ratios (D1/DO, D2/DO). The viscosity of the uncured resin paste Ps2 can be set to, for example, 1.0 Pa·s or more and 50 Pa·s or less.

Other conditions of Step S33 can also be appropriately determined. In addition to the above-mentioned conditions, for example, the time of immersion into the uncured resin paste Ps2 or the temperature of the uncured resin paste Ps2 may be changed while checking the shape of the uncured resin to be formed. Further, the uncured resin layer 15u obtained after immersion can be dried under a predetermined condition.

5.3.4 Step S34: Thermosetting Treatment

In Step S34, the uncured resin layers 15u formed are cured by heat treatment. The temperature of heat treatment can be set to approximately 100 to 500° C., for example. The heat treatment can be performed in a reduction atmosphere or a low-oxygen partial pressure atmosphere, for example. Thus, the uncured resin layers 15u are thermally cured, so that the conductive resin layers 15 are formed.

5.3.5 Step S35: Formation of Plating Layers

In Step S35, plating layers 16 are formed by wet plating treatment on the base layers 14 and the conductive resin layers 15 formed on the ceramic body 11. The plating layer 16 may be obtained by, for example, forming Ni plating on the conductive resin layer 15 and further forming Sn plating thereon. Thus, the first and second external electrodes 13a and 13b are completed. Since the plating layer 16 along the contour of the base layer 14 and conductive resin layer 15 is formed by the wet plating treatment, the first convex portion 131 and the second convex portion 132 resulting from the shape of the conductive resin layer 15 are formed on each of the first and second external electrodes 13a and 13b.

5.4 Modified Examples

The production method described above can be variously modified as long as the configuration of the multi-layer ceramic capacitor 10 of this embodiment can be obtained. For example, the method of forming the first and second external electrodes 13a and 13b is not limited to the method described above as long as the base layer 14 and the conductive resin layer 15 can be formed. For example, the method of forming the uncured resin layers 15u is not limited to the method involving forming the water-repellent region Q. A mask to expose a region, in which the conductive resin layer 15 is to be formed, may be formed on the ceramic body 11 to cause a conductive resin paste to adhere to the region expose from the mask.

6. OTHER EMBODIMENTS

While the embodiment of the present disclosure has been described, the present disclosure is not limited to the embodiment described above, and it should be appreciated that the present disclosure may be variously modified.

The conductive resin layer 15 only needs to be located at the main-surface-covering portion 13m of at least one main surface (the first main surface M1), and is not necessarily located at the end-surface-covering portion 13e and the side-surface-covering portions 13s. Further, the main-surface-covering portion 13m including the first convex portion 131 and the second convex portion 132 only needs to be located at least on one main surface (the first main surface M1).

Each of the first and second external electrodes 13a and 13b need not include the side-surface-covering portions 13s.

The shape of the first and second convex portions 131 and 132 is not limited to the above-mentioned example, and the first peak dimension D1 and the second peak dimension D2 may be the same, for example.

For example, the base layer 14 may include a plurality of layers. For example, the base layer 14 may include a sintered film and a plating film. Alternatively, the base layer 14 may include a sputtered film and a sintered film.

The first and second internal electrodes 12a and 12b are not limited to be alternately disposed along the Z-axis direction, and may be alternately disposed in the Y-axis direction, for example.

The multi-layer ceramic capacitor according to this embodiment is not limited to be of a two-terminal type, and can also be configured to be of a three-terminal type.

Furthermore, the present disclosure is applicable not only to the multi-layer ceramic capacitors but also to any other multi-layer ceramic electronic components each including external electrodes. Examples of such multi-layer ceramic electronic components to which the present disclosure is applicable include a chip varistor, a chip thermistor, and a multi-layer inductor, in addition to the multi-layer ceramic capacitors.

It will be apparent to those skilled in the art that various modifications and variations can be made in the present disclosure without departing from the spirit or scope of the disclosure. Thus, it is intended that the present disclosure cover modifications and variations that come within the scope of the appended claims and their equivalents. In particular, it is explicitly contemplated that any part or whole of any two or more of the embodiments and their modifications described above can be combined and regarded within the scope of the present disclosure.

What is claimed is:

1. A multi-layer ceramic electronic component, comprising:
   a ceramic body including
      a pair of main surfaces perpendicular to a first axis,
      a pair of end surfaces perpendicular to a second axis orthogonal to the first axis,
      a pair of side surfaces perpendicular to a third axis orthogonal to the first axis and the second axis, and
      a plurality of internal electrodes drawn to the pair of end surfaces,
   the ceramic body having a substantially rectangular parallelepiped shape; and
   a pair of external electrodes facing each other in a direction of the second axis and each including
      an end-surface-covering portion that covers one of the pair of end surfaces, and
      a main-surface-covering portion that is formed to be continuous from the end-surface-covering portion and covers a part of one of the pair of main surfaces,
      the main-surface-covering portion including
      a conductive resin layer, and
      a first convex portion and a second convex portion that are formed on a basis of a shape of the conductive resin layer, each swell toward the center in the direction of the second axis, and are disposed apart from each other in a direction of the third axis.

2. The multi-layer ceramic electronic component according to claim 1, wherein
   the main-surface-covering portion has
      a first peak dimension in the direction of the second axis from an outer edge of the main-surface-covering portion to a first top of the first convex portion, the outer edge being located outward in the direction of the second axis, the first top being most adjacent to the center in the direction of the second axis, and
      a second peak dimension in the direction of the second axis from the outer edge to a second top of the second convex portion, the second top being most adjacent to the center in the direction of the second axis, and
   each of the first peak dimension and the second peak dimension is 1.5 times or more a minimum dimension of the main-surface-covering portion in the direction of the second axis.

3. The multi-layer ceramic electronic component according to claim 1, wherein
   the main-surface-covering portion has
      a first peak dimension in the direction of the second axis from an outer edge of the main-surface-covering portion to a first top of the first convex portion, the outer edge being located outward in the direction of the second axis, the first top being most adjacent to the center in the direction of the second axis, and
      a second peak dimension in the direction of the second axis from the outer edge to a second top of the second convex portion, the second top being most adjacent to the center in the direction of the second axis, and
   each of the first peak dimension and the second peak dimension is 1/10 or more and 2/5 or less of a dimension of the multi-layer ceramic electronic component in the direction of the second axis.

4. The multi-layer ceramic electronic component according to claim 1, wherein
   the main-surface-covering portion has
      a first peak dimension in the direction of the second axis from an outer edge of the main-surface-covering portion to a first top of the first convex portion, the outer edge being located outward in the direction of the second axis, the first top being most adjacent to the center in the direction of the second axis, and
      a second peak dimension in the direction of the second axis from the outer edge to a second top of the second convex portion, the second top being most adjacent to the center in the direction of the second axis, and
   the first peak dimension is larger than the second peak.

5. The multi-layer ceramic electronic component according to claim 4, wherein
   the first peak dimension is 1.1 times or more and 1.5 times or less the second peak dimension.

6. The multi-layer ceramic electronic component according to claim 1, wherein
   a separation distance in the direction of the third axis between a first top of the first convex portion most adjacent to the center in the direction of the second axis and a second top of the second convex portion most adjacent to the center in the direction of the second axis is 1/5 or more and 1/2 or less of a dimension of the multi-layer ceramic electronic component in the direction of the third axis.

7. The multi-layer ceramic electronic component according to claim 1, wherein
   each of the pair of external electrodes further includes
      a base layer extending from the end-surface-covering portion to a part of the main-surface-covering portion, and
      a plating layer constituting a superficial layer of the end-surface-covering portion and the main-surface-covering portion,
   the conductive resin layer covers the base layer and extends toward the center in the direction of the second axis beyond the base layer in the main-surface-covering portion, and
   the first convex portion and the second convex portion each have a laminated structure including the conductive resin layer and the plating layer.

8. A circuit board, comprising:
a multi-layer ceramic electronic component; and
a mounting substrate including a connection electrode,
the multi-layer ceramic electronic component including a ceramic body including
- a pair of main surfaces perpendicular to a first axis,
- a pair of end surfaces perpendicular to a second axis orthogonal to the first axis,
- a pair of side surfaces perpendicular to a third axis orthogonal to the first axis and the second axis, and
- a plurality of internal electrodes drawn to the pair of end surfaces, the ceramic body having a substantially rectangular parallelepiped shape; and a pair of external electrodes facing each other in a direction of the second axis and each including
- an end-surface-covering portion that covers one of the pair of end surfaces, and
- a main-surface-covering portion that is formed to be continuous from the end-surface-covering portion and covers a part of one of the pair of main surfaces, the main-surface-covering portion including
  - a conductive resin layer, and
  - a first convex portion and a second convex portion that are formed on a basis of a shape of the conductive resin layer, each swell toward the center in the direction of the second axis, and are disposed apart from each other in a direction of the third axis,
- the main-surface-covering portion being disposed to face the connection electrode.

* * * * *